US008786741B2

(12) United States Patent
Timm et al.

(10) Patent No.: US 8,786,741 B2
(45) Date of Patent: Jul. 22, 2014

(54) DIGITAL MULTI-SPECTRAL CAMERA SYSTEM HAVING AT LEAST TWO INDEPENDENT DIGITAL CAMERAS

(75) Inventors: Martin Timm, Aalen (DE); Martin Welzenbach, Aalen (DE)

(73) Assignee: Leica Geosystems AG, Heerbrugg (CH)

(*) Notice: Subject to any disclaimer, the term of this patent is extended or adjusted under 35 U.S.C. 154(b) by 0 days.

(21) Appl. No.: 13/824,976

(22) PCT Filed: Jul. 21, 2011

(86) PCT No.: PCT/EP2011/062505
§ 371 (c)(1),
(2), (4) Date: May 22, 2013

(87) PCT Pub. No.: WO2012/041553
PCT Pub. Date: Apr. 5, 2012

(65) Prior Publication Data
US 2013/0242131 A1 Sep. 19, 2013

(30) Foreign Application Priority Data
Sep. 28, 2010 (DE) .................. 10 2010 041 569

(51) Int. Cl.
H04N 9/083 (2006.01)
H04N 3/14 (2006.01)
H04N 5/335 (2011.01)
H04N 9/04 (2006.01)
H04N 5/228 (2006.01)
H04N 9/73 (2006.01)

(52) U.S. Cl.
USPC ........ 348/276; 348/277; 348/273; 348/223.1; 348/224.1; 348/222.1

(58) Field of Classification Search
CPC ............ H04N 9/045; H04N 2209/045; H04N 21/41407; H04N 2209/048; H04N 5/35563; H04N 2209/046; G03B 19/00; G06T 3/4015; H01L 27/14621; H01L 27/14627; H01L 27/14645

USPC ................ 348/266–283, 222.1, 223.1, 224.1, 348/225.1
See application file for complete search history.

(56) References Cited

U.S. PATENT DOCUMENTS
5,900,942 A    5/1999  Spiering
7,683,951 B2 * 3/2010  Aotsuka .................... 348/275
(Continued)

FOREIGN PATENT DOCUMENTS
DE    10 2005 045 036    3/2007

OTHER PUBLICATIONS
Diener et al., Radiometric Normalisiation and Colour Composite Generation of the DMC, International Archives of Photogrammetry and Remote Sensing. vol. XXXIII, Part B1. Amsterdam, Jan. 2000. URL: http://www.isprs.org/proceedings/xxxiii/congress/part1/82_xxxiii-part1.pdf.

Primary Examiner — Chia-Wei A Chen
(74) Attorney, Agent, or Firm — Maschoff Brennan

(57) ABSTRACT

A digital camera system having at least two independent digital cameras, which capture image signals in different narrow-band spectral ranges, wherein each of the at least two independent digital cameras comprises at least one separate two-dimensional digital image sensor, preferably a CCD sensor or a CMOS sensor, and at least one filter element corresponding to the particular narrow-band spectral range connected upstream of the at least one two-dimensional digital image sensor and having at least one filter region. The at least one color filter element additionally comprises at least one neutral region, which is translucent in a spectral range that includes at least the different narrow-band spectral ranges of the at least two independent digital cameras, in particular in a panchromatic spectral range, and which is assigned to at least one specific neutral, in particular unused, pixel region of the associated at least one two-dimensional digital image sensor.

9 Claims, 2 Drawing Sheets

(56) References Cited

U.S. PATENT DOCUMENTS

| | | | |
|---|---|---|---|
| 8,564,699 B2* | 10/2013 | Alleysson et al. | 348/272 |
| 8,681,250 B2* | 3/2014 | Culbert et al. | 348/262 |
| 2004/0263637 A1* | 12/2004 | Serizawa et al. | 348/222.1 |
| 2005/0151861 A1* | 7/2005 | Bornstein et al. | 348/275 |
| 2005/0195299 A1* | 9/2005 | Jaspers | 348/272 |
| 2006/0044429 A1* | 3/2006 | Toda et al. | 348/272 |
| 2007/0210244 A1 | 9/2007 | Halvis et al. | |
| 2009/0051793 A1* | 2/2009 | Smith | 348/266 |
| 2010/0053385 A1* | 3/2010 | Choe et al. | 348/273 |
| 2010/0157091 A1* | 6/2010 | Honda et al. | 348/223.1 |
| 2010/0165138 A1* | 7/2010 | Jannard | 348/222.1 |
| 2010/0182464 A1* | 7/2010 | Lukac | 348/273 |
| 2010/0232692 A1 | 9/2010 | Kumar | |
| 2011/0108708 A1* | 5/2011 | Olsen et al. | 250/208.1 |
| 2011/0249086 A1* | 10/2011 | Guo et al. | 348/14.12 |
| 2012/0105667 A1* | 5/2012 | Watanabe | 348/222.1 |
| 2012/0162465 A1* | 6/2012 | Culbert et al. | 348/223.1 |
| 2013/0277533 A1* | 10/2013 | Olsen et al. | 250/208.1 |

\* cited by examiner

DIGITAL MULTI-SPECTRAL CAMERA SYSTEM HAVING AT LEAST TWO INDEPENDENT DIGITAL CAMERAS

FIELD OF THE INVENTION

The invention relates to a digital camera system with at least two independent digital cameras. The invention likewise relates to a color filter element and a method for determining deviations in the exposure times and/or the recorded light quantities between at least two independent digital cameras of a digital camera system, and to a method for restoring a color balance for a digital camera system. Moreover, the invention also relates to an image processing unit of a camera system.

BACKGROUND

DE 10 2005 045 036 A1 specifies a multispectral camera and a method for generating image information using a multispectral camera.

In digital camera systems with a plurality of independent cameras or camera heads, which have shutters and corresponding digital sensors for defining the light quantity to be recorded or the exposure time, it is possible for the individual cameras to deviate from one another as a result of production-dependent scattering in the shutter and sensor behavior.

In a multispectral camera, in which the individual or separate or independent camera heads each record light of an image of the same scene in different spectral or wavelength regions, which are separated by corresponding upstream color filter elements, more particularly as a result of a simultaneous or synchronous image recording by all camera heads, in which the image signals are subsequently combined to form a multispectral image, the same light quantity or exposure time during the image recording should where possible accrue for all independent camera heads. It is for this reason that the aforementioned deviations or tolerances caused by the slightly different exposure times of the individual camera heads can disadvantageously lead to color casts in the multispectral image.

It is common practice to use position sensors or the like to carry out approximate measurements in respect of the actual exposure times of the individual camera heads and already use this to calculate approximately a necessary color balancing. However, it proves impossible to undertake more precise estimations as a result of the different light quantities or image information, which are caused by the different color channels or color filters in the individual cameras.

SUMMARY

The present invention is based on the object of improving further a digital camera system of the type mentioned at the outset in respect of the color balancing of the recorded images.

The invention proposes a digital camera system with at least two independent digital cameras, which capture image signals in different narrow-band spectral regions, wherein the at least two independent digital cameras each have at least one separate sheetlike digital image sensor, preferably a CCD sensor or CMOS sensor, and at least one color filter element with at least one filter region, which at least one color filter element is arranged in front of the at least one sheetlike digital image sensor in the direction of the entry light or upstream of the sheetlike digital image sensor and corresponds to the respective narrow-band spectral region, and wherein the at least one color filter element additionally has at least one neutral region or a region of neutral density, which is light-transmissive in a spectral region, which at least comprises the different narrow-band spectral regions of the at least two independent digital cameras, more particularly in a panchromatic spectral region, and which is associated with a specific neutral, more particularly unused, pixel region of the associated at least one sheetlike digital image sensor.

The neutral region of the color filter element advantageously allows light in the required whole wavelength spectrum to pass without modification or has a very high degree of transmission in the required wavelength spectrum of at least 95% for example. Hence the independent digital cameras obtain the same type of light and light quantity through this neutral region because the filter characteristic of the neutral region or the neutral density region is substantially configured the same in all independent cameras. As a result of the fact that the neutral region of the color filter element is now associated with a specific neutral, in particular unused, pixel region of the associated at least one sheetlike digital image sensor, or arranged over the latter, exactly the same light quantity for the image information accrues in the different independent digital cameras. If deviations occur in the neutral or unused pixel regions during a synchronous image recording by all independent digital cameras, these deviations are not due to the different color channels but due to the different shutter times or other, in particular mechanical, tolerances. According to this it is possible to perform an appropriate balancing calculation during the image processing, wherein too strong color components are damped accordingly or there is normalization or the like.

It is particularly advantageous if the sheetlike digital image sensor has a pixel region which in any case is unused by the application and can be used as neutral region. Here the neutral pixel region should be sufficiently large (e.g. 2000 pixels or the like) since a transition region with an appropriate size should also be provided between the different regions of the color filter element (between the different types of glass).

The at least two independent digital cameras can each have a separate shutter and/or a separate objective lens. The measures according to the invention are particularly advantageous in such an arrangement because there can be relatively large deviations in the exposure times and/or the recorded light quantities between the at least two independent digital cameras.

The at least two independent digital cameras can be arranged in such a way with respect to one another that at least approximately the same scene can be recorded in the different narrow-band spectral regions of the at least two independent digital cameras and a multispectral image of the scene or of the captured image signals can be combined from the image signals of the different color channels or narrow-band spectral regions.

The at least two independent digital cameras can have substantially equivalent recording properties apart from the respective color filter elements thereof corresponding to the different color sensitivities or narrow-band spectral regions and/or have substantially the same design, wherein the sheetlike digital image sensors thereof, the optionally present separate shutters thereof and/or the objective lenses thereof have substantially the same design.

It is advantageous if the at least one color filter element has two strip-shaped neutral regions at opposite sides of the filter region. The use of a plurality of different neutral filter regions allows improved or more precise balancing of the optical deviations.

The digital camera system can be embodied as multispectral camera system with four independent digital cameras, which digital camera system comprises a first independent digital camera with a first color filter element, which is light-transmissive in a spectral region with wavelengths from approximately 600 nm to approximately 700 nm or for red light, a second independent digital camera with a second color filter element, which is light-transmissive in a spectral region with wavelengths from approximately 500 nm to approximately 600 nm or for green light, a third independent digital camera with a third color filter element, which is light-transmissive in a spectral region with wavelengths from approximately 400 nm to approximately 500 nm or for blue light, and a fourth independent digital camera with a fourth color filter element, which is light-transmissive in a spectral region with wavelengths from approximately 700 nm to approximately 900 nm or for near infrared light.

The first, the second, the third and the fourth color filter element can respectively have a neutral region, which is light-transmissive in a spectral region from approximately 400 nm to approximately 900 nm. As a result, the whole spectral region of the color filter elements is covered by the neutral regions of the color filter elements.

The digital camera system can be used as multispectral digital camera system for photogrammetry for recording aerial images from aircraft.

Claim 9 specifies a color filter element for at least one sheetlike digital image sensor.

Claim 10 specifies a method for determining deviations in the exposure times and/or the recorded light quantities between at least two independent digital cameras of a digital camera system, more particularly during synchronous image recording by the at least two independent cameras, preferably of the same scene, wherein, after the synchronous image recording has taken place, the light quantities recorded in the respective neutral pixel regions of the sheetlike digital image sensors of the at least two independent digital cameras are compared to one another.

Claim 11 proposes a method for setting a color balance for a digital camera system, wherein the deviations in the exposure times and/or the recorded light quantities between the at least two independent digital cameras of the digital camera system are determined, whereupon, while processing an image of the same scene recorded synchronously in the respective different narrow-band spectral regions or color channels by the at least two independent camera systems, an equalization calculation is performed in such a way that the respective narrow-band spectral regions are left unchanged, damped or amplified, i.e. normalized, in accordance with the previously determined deviations.

Moreover, claim 12 specifies an image processing unit of a digital camera system.

BRIEF DESCRIPTION OF THE DRAWINGS

Advantageous embodiments and developments of the invention emerge from the dependent claims. In the following text, the principle of an exemplary embodiment of the invention is specified on the basis of the drawing.

In detail.

DETAILED DESCRIPTION

The digital, more particularly multispectral, camera system according to the invention will, in the following text, be used as photogrammetric aerial image recording instrument for recording aerial images from aircraft (not shown). In further exemplary embodiments (not illustrated), the digital camera system according to the invention can also, for example, be used in a microscope or the like.

Figure 1:
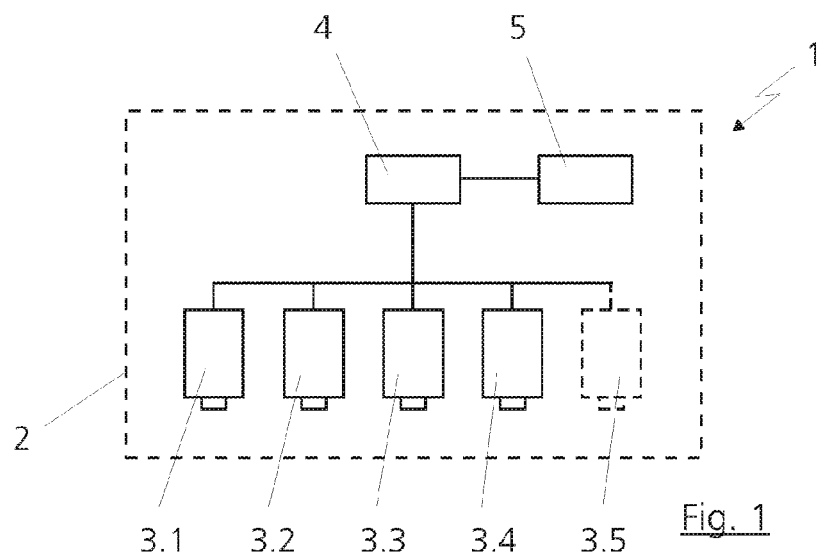
FIG. 1 shows a schematic illustration of a multispectral camera system according to the invention, having four independent digital cameras.

FIG. 1 shows a photogrammetric aerial image recording instrument 1 with a multispectral digital camera system according to the invention with four independent digital cameras 3.1 to 3.4, which capture image signals in different narrow-band spectral regions and transmit these to an image processing unit 4. The image processing unit 4 subsequently transmits the signals to an image storage unit 5. The digital camera system 2 according to the invention can additionally have a high-resolution panchromatic independent digital camera 3.5 (indicated by dashes), with the independent digital cameras 3.1 to 3.4 having a low-resolution configuration.

The arrangement of the independent digital cameras 3.1 to 3.5 in the digital camera system 2 according to the invention has been illustrated in a much simplified form in FIG. 1 and differs substantially from the actual arrangement of the independent digital cameras 3.1 to 3.5.

The four independent digital cameras 3.1 to 3.4 are arranged with respect to one another in such a way that the same scene can, at least approximately, be recorded in the different narrow-band spectral regions thereof and can, particularly in the image processing unit 4, be combined into a multispectral image of the scene from the image signals of the different narrow-band spectral regions. During the combination, use can optionally also be made of the independent digital panchromatic camera 3.5.

Figure 2:
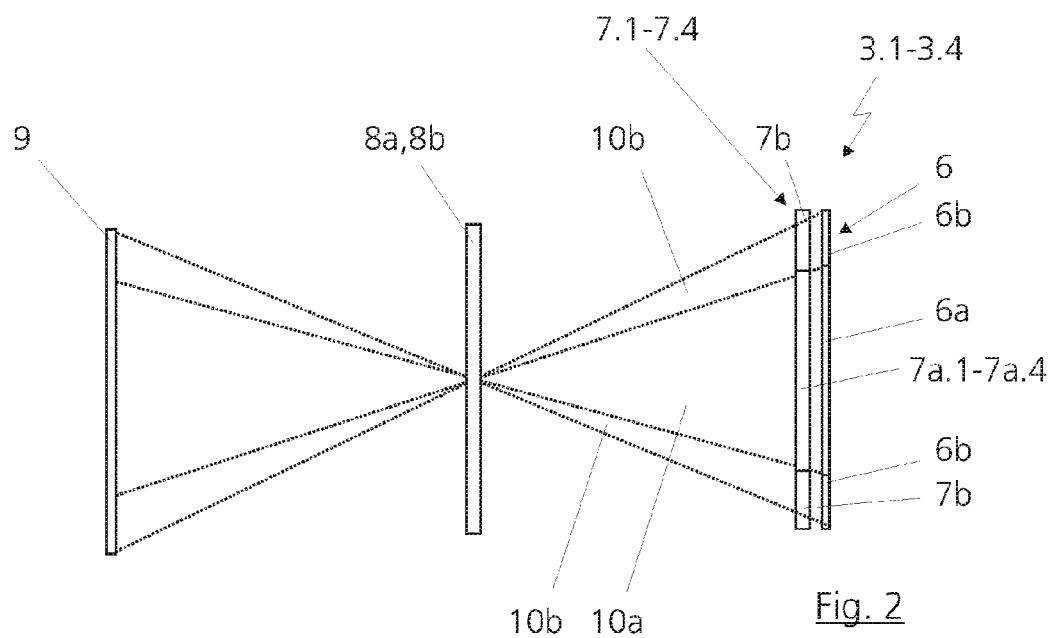
FIG. 2 shows a schematic illustration of an independent digital camera of the multispectral digital camera system according to the invention, from FIG. 1.

FIG. 2 illustrates an individual independent digital camera 3.1 to 3.4 of the digital camera system 2 according to the invention. Here the independent digital camera 3.1 to 3.4 respectively has a separate sheetlike digital image sensor 6, embodied as CCD sensor, and a color filter element 7.1 to 7.4, arranged upstream of the sheetlike digital image sensor 6, with a filter region 7a.1 to 7a.4 for the respective narrow-band spectral region (see also FIGS. 3 and 4). In further exemplary embodiments, the digital image sensor can also be embodied as CMOS sensor for the respective narrow-band spectral region.

The color filter element 7.1 to 7.4 has two neutral regions 7b, which is light-transmissive in a spectral region ND which at least comprises the different narrow-band spectral regions of the four independent digital cameras 3.1 to 3.4, more particularly in a panchromatic spectral region. The neutral regions 7b or the regions of neutral density of the color filter element 7.1 to 7.4 are associated with two specific neutral, in particular unused, pixel regions 6b of the associated sheetlike digital image sensor 6. The region of the sheetlike digital image sensor 6 used for recording the image signals of the scene for the multispectral image is provided with the reference sign 6a.

The independent digital camera 3.1 to 3.4 has a separate shutter 8a and a separate objective lens 8b, i.e. a separate optical unit. The scene 9 to be recorded is illustrated in a simplified fashion in FIG. 2. As is possible to identify further from FIG. 2, the digital image sensor 6 records the scene 9. In the process, the utilized pixel region 6a is exposed by light 10a which passes through the filter region 7a.1 to 7a.4 of the color filter element 7.1 to 7.4. The filter region 7a.1 to 7a.4 is configured in such a way that only light with the corresponding wavelength passes therethrough. The unused pixel region 6b of the digital sheetlike image sensor 6 are exposed by light 10b which passes through the neutral regions 7b of the color filter element 7 which are associated with the unused pixel regions 6b.

Apart from the respective color filter elements 7.1 to 7.4 thereof which correspond to the different narrow-band spectral regions, the four independent digital cameras 3.1 to 3.4 have substantially the same recording properties and/or have substantially the same design, wherein the sheetlike digital image sensors 6 thereof, the separate shutters 8a thereof and the objective lenses 8b thereof substantially have the same design.

Figure 3:
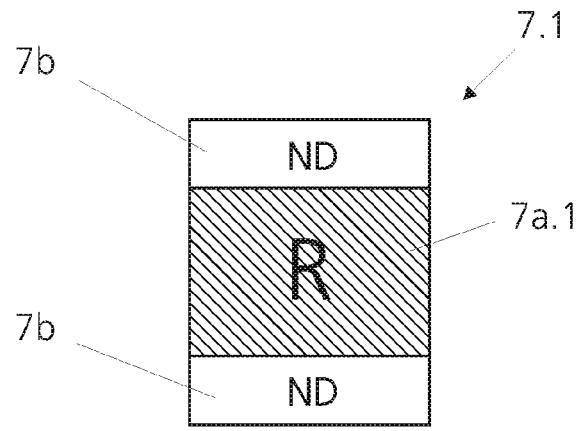
FIG. 3 shows a schematic illustration of a color filter element.

FIG. 3 illustrates a color filter element 7.1 with a filter region 7a.1 which is light-transmissive in a red narrow-band spectral region R with wavelengths from approximately 600 nm to approximately 700 nm. FIG. 3 is a plan view of the color filter element 7.1 while FIG. 2 shows a side view of such a color filter element 7.1. The color filter element 7.1 has two strip-shaped neutral regions 7b on opposite sides of the filter region 7a.1. The color filter element 7.1 can also be referred to as strip filter.

The color filter element 7.1 for the sheetlike digital image sensor 6 has the filter region 7a.1 for the first spectral region R of the light to be passed and the neutral region 7b for the second spectral region ND, wherein the second spectral region ND of the neutral region 7b is broader than the first narrow-band spectral region R of the filter region 7a.1 and comprises the latter.

Figure 4:
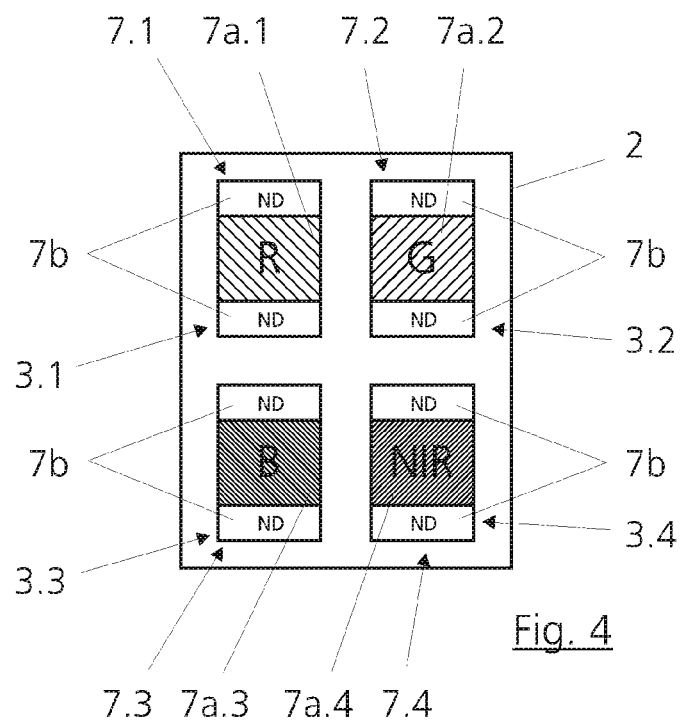
FIG. 4 shows a schematic illustration of an arrangement of four color filter elements in the multispectral digital camera system according to the invention.

FIG. 4 shows a front view of the digital camera system 2 according to the invention with correspondingly independent digital cameras 3.1 to 3.4, arranged next to one another, of which only the respective color filter elements 7.1 to 7.4 thereof are shown in FIG. 4. The associated sheetlike digital image sensors 6 are arranged under the color filter elements 7.1 to 7.4. The separate shutters 8a and objective lenses 8b of the cameras 3.1 to 3.4 are likewise not shown in FIG. 4. The first independent digital camera 3.1 is provided with a first color filter element 7.1, which is substantially only light-transmissive in the spectral region R with wavelengths from approximately 600 nm to approximately 700 nm. The second independent digital camera 3.2 is provided with the second color filter element 7.2, which is substantially only light-transmissive in a spectral region G for green light with wavelengths from approximately 500 nm to approximately 600 nm. The third independent digital camera 3.3 is provided with the third color filter element 7.3, which is substantially only light-transmissive in a spectral region B for blue light with wavelengths from approximately 400 nm to approximately 500 nm. The fourth independent digital camera 3.4 is provided with a fourth color filter element 7.4, which is substantially only light-transmissive in a spectral region NIR for near infrared light with wavelengths from approximately 700 nm to approximately 900 nm. The first, the second, the third and the fourth color filter element 7.1 to 7.4 respectively has a neutral region 7b, which is light-transmissive in a spectral region ND from approximately 400 nm to 900 nm. Moreover, the color filter elements 7.1 to 7.4 have corresponding filter regions 7a.1 to 7a.4 for the respective spectral regions R, G, B, NIR. The aforementioned spectral regions R, G, B, NIR are purely exemplary. In further exemplary embodiments (not illustrated), other applications as desired with corresponding other spectral regions come into consideration.

The image processing unit 4 of the digital camera system 2 is configured to carry out a method for determining deviations in the exposure times and/or the recorded light quantities between the independent digital cameras 3.1 to 3.4 of the digital camera system 2, wherein, particularly in the case of synchronous image recording of preferably the same scene 9 by the independent digital cameras 3.1 to 3.4, the recorded light quantities in the respective neutral pixel regions 6b of the sheetlike digital image sensors 6 of the independent digital cameras 3.1 to 3.4 are compared to one another after the synchronous image recording took place.

Moreover, the image processing unit 4 of the digital camera system 2 is configured to carry out a method for setting a color balance for the digital camera system 2, wherein the deviations in the exposure times and/or the recorded light quantities between the four independent digital cameras 3.1 to 3.4 of the digital camera system 2 are determined by means of the aforementioned method, whereupon, while processing an image of the same scene 9 recorded synchronously in the respective different narrow-band spectral regions R, G, B, NIR by the four independent digital cameras 3.1 to 3.4, an equalization calculation is performed in such a way that the image signals of the respective narrow-band spectral regions R, G, B, NIR are respectively left unchanged, damped or amplified in accordance with the previously determined deviations and hence there is a corresponding normalization of the color channels R, G, B, NIR.

What is claimed is:

1. A digital camera system, comprising:
   an image processing unit; and
   at least two independent digital cameras, which capture image signals in different narrow-band spectral regions, which each have a separate shutter and/or a separate objective lens and which each have at least one separate sheet-like digital image sensor and at least one color filter element with at least one filter region, which at least one color filter element is arranged upstream of the at least one sheet-like digital image sensor and corresponds to the respective narrow-band spectral region, which at least one color filter element additionally has at least one neutral region, which is light-transmissive in a spectral region, which at least comprises the different narrow-band spectral regions of the at least two independent digital cameras and which is arranged over at least one specific neutral pixel region of the associated at least one sheet-like digital image sensor, wherein the image processing unit is configured to carry out a method for setting a color balance for the digital camera system, wherein deviations in the exposure times and/or the recorded light quantities between the at least two independent digital cameras of the digital camera system are determined during synchronous image recording by the at least two independent cameras of the same scene, wherein, after the synchronous image recording has taken place, the light quantities recorded in the respective neutral pixel regions of the sheet-like digital image sensors of the at least two independent digital cameras are compared to one another, whereupon, while processing an image of the same scene recorded synchronously in the respective different narrow-band spectral regions by the at least two independent digital cameras, an equalization calculation is performed in such a way that the image signals of the respective narrow-band spectral regions are respectively left unchanged, damped or amplified in accordance with the previously determined deviations.

2. The digital camera system as claimed in claim 1, wherein the at least two independent digital cameras are arranged in such a way with respect to one another that at least approximately the same scene can be recorded in the different narrow-band spectral regions of the at least two independent digital cameras and a multispectral image of the scene can be combined from the image signals of the different narrow-band spectral regions.

3. The digital camera system as claimed in claim 1, wherein the at least two independent digital cameras have substantially equivalent recording properties apart from the respective color filter elements thereof corresponding to the different narrow-band spectral regions and/or have substantially the same design, wherein the sheet-like digital image sensors thereof, the optionally present separate shutters thereof and the objective lenses thereof have substantially the same design.

4. The digital camera system as claimed in claim 1, wherein the at least one color filter element has two strip-shaped neutral regions at opposite sides of the filter region.

5. The digital camera system as claimed in claim 1, further comprising:
 a first independent digital camera with a first color filter element, which is light-transmissive in a spectral region with wavelengths from approximately 600 nm to approximately 700 nm;
 a second independent digital camera with a second color filter element, which is light-transmissive in a spectral region with wavelengths from approximately 500 nm to approximately 600 nm;
 a third independent digital camera with a third color filter element, which is light-transmissive in a spectral region with wavelengths from approximately 400 nm to approximately 500 nm; and
 a fourth independent digital camera with a fourth color filter element, which is light-transmissive in a spectral region with wavelengths from approximately 700 nm to approximately 900 nm.

6. The digital camera system as claimed in claim 5, wherein the first, the second, the third and the fourth color filter element respectively have a neutral region, which is light-transmissive in a spectral region from approximately 400 nm to approximately 900 nm.

7. The digital camera system as claimed in claim 1 for photogrammetry for recording aerial images from aircraft.

8. A method for setting a color balance for a digital camera system as claimed in claim 1, wherein deviations in the exposure times and/or the recorded light quantities between the at least two independent digital cameras of the digital camera system are determined during synchronous image recording by the at least two independent cameras of the same scene, wherein, after the synchronous image recording has taken place, the light quantities recorded in the respective neutral pixel regions of the sheet-like digital image sensors of the at least two independent digital cameras are compared to one another, whereupon, while processing an image of the same scene recorded synchronously in the respective different narrow-band spectral regions by the at least two independent digital cameras, an equalization calculation is performed in such a way that the image signals of the respective narrow-band spectral regions are respectively left unchanged, damped or amplified in accordance with the previously determined deviations.

9. An image processing unit of a digital camera system, configured to carry out a method as claimed in claim 8.

* * * * *

UNITED STATES PATENT AND TRADEMARK OFFICE
CERTIFICATE OF CORRECTION

| | |
|---|---|
| PATENT NO. | : 8,786,741 B2 |
| APPLICATION NO. | : 13/824976 |
| DATED | : July 22, 2014 |
| INVENTOR(S) | : Martin Timm et al. |

Page 1 of 1

It is certified that error appears in the above-identified patent and that said Letters Patent is hereby corrected as shown below:

In the Specification

In Column 4, Lines 21-22, delete "system according" and insert -- system 2 according --, therefor.

Signed and Sealed this
Twenty-fourth Day of February, 2015

Michelle K. Lee
*Deputy Director of the United States Patent and Trademark Office*